United States Patent [19]
Kinokiri et al.

[11] Patent Number: 5,205,918
[45] Date of Patent: Apr. 27, 1993

[54] APPARATUS HAVING A VACUUM CHAMBER

[75] Inventors: Kyoji Kinokiri; Hisashi Ubukata, both of Tokyo, Japan

[73] Assignee: Kabushiki Kaisha Shibaura Seisakusho, Japan

[21] Appl. No.: 707,891

[22] Filed: May 30, 1991

[30] Foreign Application Priority Data

May 31, 1990 [JP] Japan .................. 2-142650

[51] Int. Cl.$^5$ ............................................ C23C 14/34
[52] U.S. Cl. ......................... 204/298.07; 204/298.25
[58] Field of Search ................. 204/192.12, 298.07, 204/298.25, 298.26, 298.27, 298.28, 298.35; 414/217, 222, 223

[56] References Cited

U.S. PATENT DOCUMENTS

| | | | |
|---|---|---|---|
| 3,981,791 | 9/1976 | Rosvold | 204/298 |
| 4,548,699 | 10/1985 | Hutchinson et al. | 204/298.25 |
| 4,820,106 | 4/1989 | Walde e al. | 204/298.25 X |
| 4,886,592 | 12/1989 | Anderle et al. | 204/298.25 |

OTHER PUBLICATIONS

Balzers Brochure, "Compact Disc Sputter System", (no date available). 4th AEJ Forum on Vacuum Equipment Industry (Nov. 21, 1989), Contamination Control in Vacuum Systems: Venting and Pumping, Strasser, G. et al.
Singulus Catalog "A Family of Single Disc Metallizing Systems".

*Primary Examiner*—Nam X. Nguyen
*Attorney, Agent, or Firm*—Wigman & Cohen

[57] ABSTRACT

An apparatus having a vacuum chamber is provided which comprises a vacuum chamber that can hold a pressure therein at a pressure different from the outside pressure, a load-lock chamber formed at a portion of the vacuum chamber, for transferring in and out an object between the outside and the vacuum chamber while holding the pressure in the vacuum chamber at a pressure different from the outside pressure, and a piping apparatus having valve mechanism, which performs the intake and exhaust of gas with respect to the load-lock chamber. The piping apparatus comprises a passage formed in the wall of the vacuum chamber, the passage communicating with the load-lock chamber and being exposed to the outer wall of the upper lid so as to be connected to means for inhaling and exhausting gas, valve members disposed on the outer wall, for directly opening and closing the passage, and means for actuating the valve members. The passage is incorporated in the wall of the vacuum chamber, so that the entire apparatus can be small-sized and the conductance with respect to the gas-flow in the passage can be significantly increased.

6 Claims, 4 Drawing Sheets

APPARATUS HAVING A VACUUM CHAMBER

BACKGROUND OF THE INVENTION

1. Field of the Invention

This invention relates to an apparatus having a vacuum chamber, in which a sputtering process is performed, e.g., for use in a continuous sputtering system. More particularly, this invention relates to the improvement of a piping apparatus having valve mechanism suitable for a load-lock chamber in which an object to be processed is transferred in and out between atmospheres different in pressure.

2. Description of the Prior Art

A compact disk (hereinafter, referred to as a CD) has been widely used to record a large amount of digitized sound and image information. The substrate of the CD is made of transparent synthetic resin on the surface of which a large number of so-called pits are formed in accordance with digital information of "1" or "0". An aluminum thin film layer having high light reflectivity is deposited on the thus formed surface by use of a sputtering technique. The thus recorded information is read by the presence or absence of the reflected light or penetrated light of a laser light beam applied to the CD.

The aluminum thin film deposition of a single substrate can be performed in a relatively short period. Thus, a continuous sputtering system shown in FIG. 5 has been used.

In FIG. 5, a transferring chamber 3 having a sputtering chamber 41 and a load-lock chamber 31 is connected to an exhaust pump 6A so as to be exhausted. The transferring chamber 3 serves to transfer a substrate 1, which is an object to be sputtered, from load-lock chamber 31 to sputtering chamber 41, and also to hold sputtering chamber 41 in the exhausted atmosphere. A receptor 32, which performs reciprocating motion between load-lock chamber 31 and sputtering chamber 41, is provided in transferring chamber 3. The load-lock chamber 31 is situated at a position in the vicinity of sputtering chamber 41, i.e., in a part of an upper lid 30 of transferring chamber 3. Specifically, load-lock chamber 31 is constituted by the inner walls of an opening 34 made in the upper lid 30, the receptor 32 and a load-lock lid 22. The receptor 32 hermetically touches the lower side of the opening 34. The load-lock lid 22, which transfers substrate 1 by sucking, serves to hermetically plug the opening 34.

When opening 34 is hermetically closed by receptor 32 from the inside, transferring chamber 3 becomes hermetically sealed. Thereafter, transferring chamber 3 is exhausted by use of exhaust pump 6A. Thus, sputtering chamber 41 is exhausted to the degree of vacuum such that a prescribed sputtering process can be performed.

On the other hand, opening 34 is plugged by load-lock lid 22, which has transferred substrate 1 using sucking pads operated by an exhaust system 6D. This constitutes load-lock chamber 31. However, the pressure in load-lock chamber 31 is still at the atmospheric pressure. If receptor 32 is moved in order to transfer the received substrate 1, the hermetic sealing state of opening 34 is inevitably released. Thus, the atmosphere in load-lock chamber 31 flows into transferring chamber 3, and decreases the degree of vacuum in transferring chamber 3 and sputtering chamber 41. As a result, valuable time must be wasted to recover the prescribed degree of vacuum for sputtering by use of the exhaust pump 6A. Therefore, an exhaust system 6B is connected to an opening made in the wall of load-lock chamber 31 so that load-lock chamber 31 can be previously exhausted. Further, when load-lock chamber 31 is exhausted by the exhaust system 6B, the pressure in load-lock chamber 31 becomes a negative pressure. This is because substrate 1 has been sucked by sucking pads to load-lock lid 22. When the vacuum source of the sucking pads is isolated, substrate 1 is released from the suction pads, and transferred to receptor 32. Thereafter, receptor 32 transfers the thus received substrate 1 to sputtering chamber 41 and presses substrate 1 against a masking portion 43 of the sputtering chamber 41. While remaining in this state, the sputtering process is performed so as to deposit an aluminum thin film on the surface of substrate 1. After the completion of the sputtering process, receptor 32 transfers substrate 1 to the load-lock portion, and hermetically touches opening 34 so as to constitute load-lock chamber 31. Thereafter, an intake system 6C, which is connected to an opening made in the wall of load-lock chamber 31, introduces the atmospheric pressure into load-lock chamber 31. Subsequently, the sucking pads are exhausted to a vacuum, and substrate 1 is sucked by the sucking pads to load-lock lid 22. The pressure in load-lock chamber 31 has been at the atmospheric pressure. Thus, load-lock lid 22 can be easily removed from the opening 34, and moved upward in a direction indicated by arrow 23 shown in FIG. 5. As a result, substrate 1 can be transferred to a subsequent process.

As described above, transferring chamber 3 can be maintained in the prescribed exhaust state throughout the processes such as the reception and delivery of substrate 1, and the sputtering. Further, substrate 1 can be smoothly transferred between the load-lock lid 22 and susceptor 32 by virtue of the approriate exhaust and intake with respect to load-lock chamber 31. Thus, the continuous sputtering system can be operated in which a large number of disk substrates can be sputtered in a short time.

The conventional exhaust and intake mechanisms of load-lock chamber 31 will be described with reference to FIGS. 6 and 7. Specifically, a common passage 61 is formed extending from an opening made in the wall of load-lock chamber 31 to an outside end. A bifurcated pipe 62, an exhaust valve 71, an intake valve 72, pipes 81 and 82, and an exhaust pump (not shown) are connected through a flange F to the outside end of common passage 61.

More specifically, when substrate 1 is transferred from load-lock lid 22 to receptor 32, substrate 1 is transferred into transferring chamber 3, and then load-lock chamber 31 must be exhausted. As shown in the enlarged view of FIG. 6, common passage 61, which serves both as an exhaust bore and as an intake bore, is connected to the external rotary pump (not shown) through bifurcated pipe 62 and exhaust valve 71. When exhaust valve 71 is opened, load-lock chamber 31 is coarsely exhausted to an intermediate degree of vacuum, and substrate 1 is transferred from load-lock lid 22 to receptor 32. Thereafter, receptor 32 is moved downward, and exhaust pump 6A is operated so as to exhaust transferring chamber 3 and load-lock chamber 31 to a higher degree of vacuum.

When the sputtered substrate 1 is transferred from receptor 32 to load-lock lid 22, the pressure in load-lock chamber 31 is changed to the atmospheric pressure in the following manner. Specifically, valve 71 is closed, and valve 72, which is connected to the other end of bifurcated pipe 62 as shown in FIG. 7, is temporarily opened so as to introduce the atmospheric pressure into load-lock chamber 31. As a result, the sputtered substrate 1 can be sucked by the sucking pads, which are exhausted by exhaust system 6B, to load-lock lid 22, and transferred to the outside. In FIG. 6, reference characters L represent O-rings for sealing, and reference numerals 81 and 82 in FIG. 7 represent pipes connected to the rotary pump and the atmospheric space, respectively.

However, as described above, the conventional piping apparatus must have the bulky valve mechanism and lengthy pipes in order to achieve the connection from load-lock chamber 31 to the exhaust rotary pump and to the atmospheric space. This is because valves 71 and 72, which are operated independently, must be connected to bifurcate pipe 62 and the like using bolts. Therefore, the conventional piping apparatus has the following disadvantages. Specifically, the bulky valve mechanism inevitably causes the apparatus to be large-sized, and the lengthy intake-exhaust piping decreases the conductance (the reciprocal of resistance of gas-flow). As a result, the function of load-lock chamber 31 as a boundary chamber between the atmosphere and vacuum cannot be sufficiently obtained.

Such disadvantages also exist in the case when valve 72 is omitted, and valve 71 is directly connected to common passage 61 in order to serve as an exclusive use for exhaust.

As described above, in the conventional piping apparatus having valve mechanism, a common passage is formed in the wall of a vacuum chamber (e.g., a load-lock chamber to be exhausted to a vacuum). However, such a common passage must be connected to independent valves provided outside the chamber. Thus, the piping apparatus inevitably becomes large-sized, and the conductance with respect to the gas-flow decreases.

SUMMARY OF THE INVENTION

Accordingly, one object of the present invention is to provide an apparatus having a vacuum chamber including a piping apparatus with simplified valve mechanism that can significantly shorten piping length, thereby the piping apparatus can be small-sized.

Briefly, in accordance with one aspect of the present invention, there is provided an apparatus having a vacuum chamber, which comprises a common passage formed in a wall constituting a vacuum chamber, the common passage communicating from a load-lock chamber to the outside, a piping apparatus having valve mechanism in which valve members are connected directly to the common passage on the outer surface of the wall, the valve member directly opening and closing the common passage.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
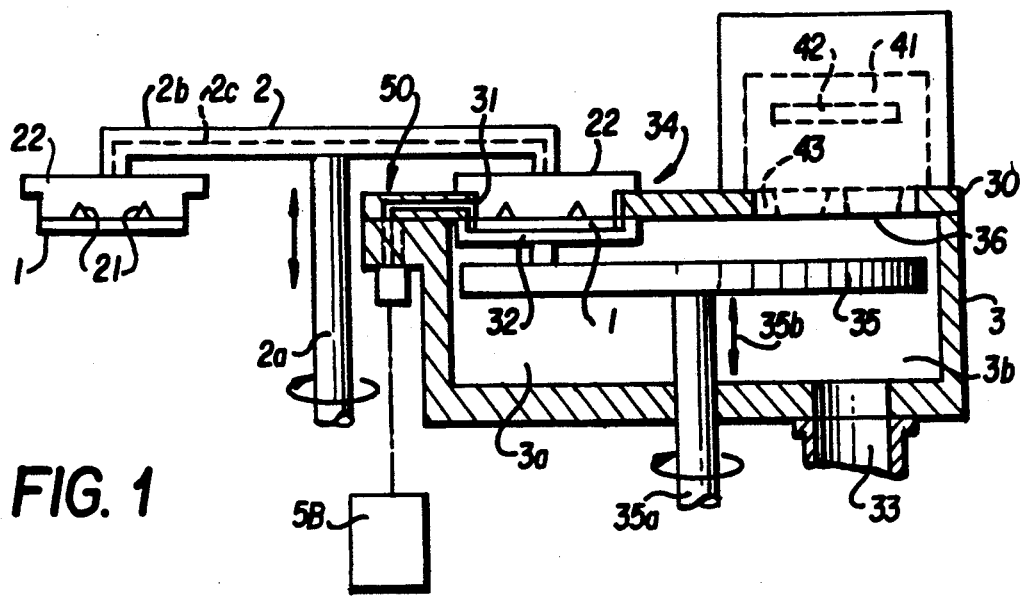
FIG. 1 is a cross-sectional view illustrating one embodiment according to the present invention, being applied to a system for use in aluminum-sputtering CD substrates.

Hereinafter, one embodiment of the present invention will be described with reference to the accompanying drawings. FIG. 1 through FIG. 4 are diagrams illustrating a piping apparatus having valve mechanism according to the present invention, and one embodiment being applied to an exhaust-intake apparatus of a load-lock chamber for use in a sputtering system. In respective drawings, like reference numerals designate identical or corresponding parts.

In FIG. 1, a transferring chamber 3 having a hermetically sealed wall is a vacuum chamber having an upper lid 30. The inside of transferring chamber 3 is classified into a load-lock portion 3a and a sputtering portion 3b. A circular opening 34 is formed in upper lid 3A at a position over load-lock portion 3a. A load-lock chamber 31, in which substrate 1 is received and delivered, is formed in upper lid 30. The load-lock chamber 31 serves to transfer in and out an object, i.e., the substrate 1 between the outside having the atmospheric pressure and the inside of transferring chamber 3 having a vacuum without deteriorating the state therein.

Specifically, substrate 1 is transferred to transferring chamber 3 by an arm-shaped transferring apparatus 2 which is rotatable around its shaft 2a and movable in a vertical direction. Further, transferring apparatus 2 is provided with a plurality of load-lock lids 22, each having plural sucking pads 21. The substrate 1 is sucked by suction pads 21 to one of load-lock lids 22, and transferred to transferring chamber 3. The suction pads 21 are connected to an exhaust pipe 2c provided piercing through an arm 2b of transferring apparatus 2.

More specifically, CD disk substrate 1 has a diameter of about 12 cm. The load-lock chamber 31, which receives and delivers substrate 1, has a diameter of about 13 cm and an internal cubic volume of about 200 ml. The transferring chamber 3 has an internal cubic volume of about 20 l while sputtering chamber 41 has that of about 1 l.

Further, a transferring table 35, which is rotatable around its shaft 35a and movable in a vertical direction 35b, is provided in transferring chamber 3. The substrate 1 is held by a receptor 32, which is fixed to table 35 and serves as a lower wall of load-lock chamber 31, and is transferred from load-lock portion 3a to sputtering portion 3b.

A sputtering chamber 41 and a sputtering source 42 are disposed over the sputtering portion 3b through an opening 36 made in upper lid 30. Further, a mask 43, which receives substrate 1, is attached to opening 36. An aluminum thin film is deposited by sputtering on the upper surface of substrate 1 being in close contact with the lower surface of mask 43. This sputtering is performed in a short period of about 2 seconds. The sputtering chamber 41 is exhausted using an exhaust vent 33 of transferring chamber 3 while substrate 1 is not being in close contact with mask 43. In this case, the degree of vacuum in sputtering chamber 41 is $10^{-4}$ Torr at a minimum.

The load-lock chamber 31 of upper lid 30 serves as a boundary chamber between the atmosphere and vacuum. Specifically, the boundary chamber is used when substrate 1 is transferred from load-lock lid 22 to receptor 32, or when the sputtered substrate 1 is transferred from receptor 32 to load-lock lid 22 after the prescribed film deposition.

Figure 3:
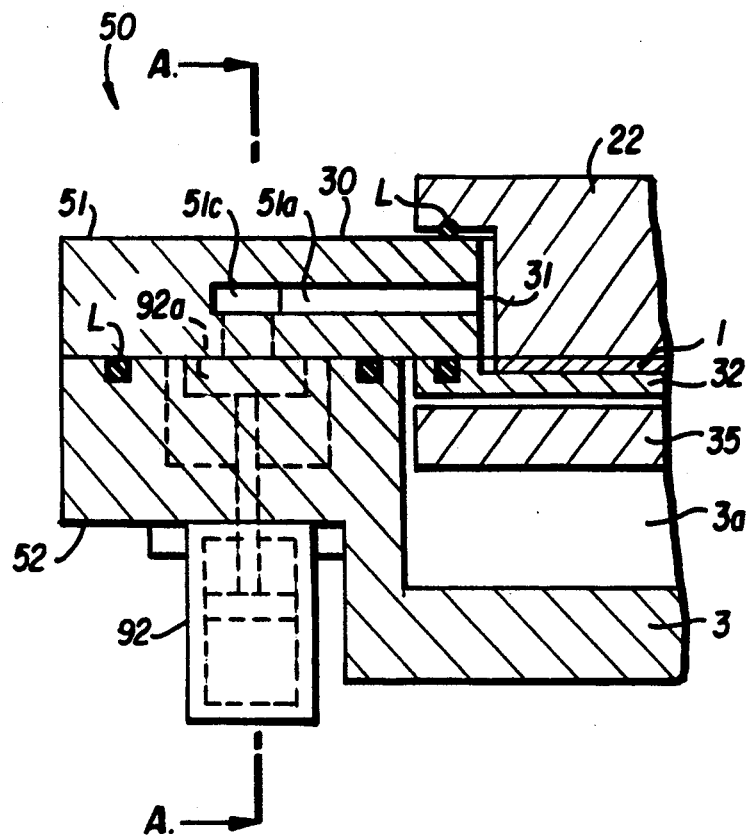
FIG. 3 is a partial cross-sectional view illustrating an essential portion of the embodiment shown in FIG. 1.

A piping apparatus 50 of this invention is directly incorporated in a wall 51 at a position closest to the load-lock chamber 31 of upper lid 30, and also in a flange-shaped wall 52 extending from transferring chamber 3, as shown in FIG. 3.

Specifically, in FIG. 3, a common passage 51a is formed laterally in the wall 51 of upper lid 30 constituting load-lock chamber 31. Further, one end of common passage 51a is exposed to the inside of load-lock chamber 31.

Figure 2:
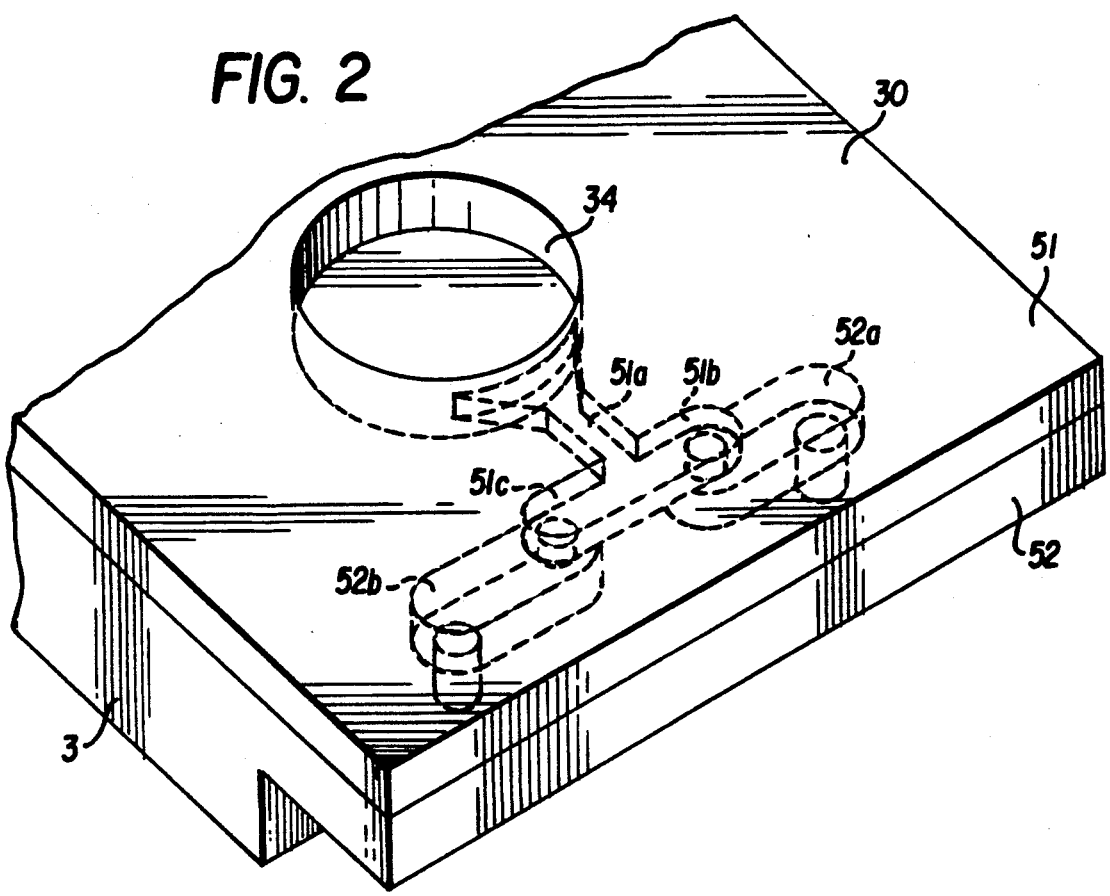
FIG. 2 is a partial perspective view transparently illustrating a part of an essential portion of the embodiment shown in FIG. 1.
Figure 4:
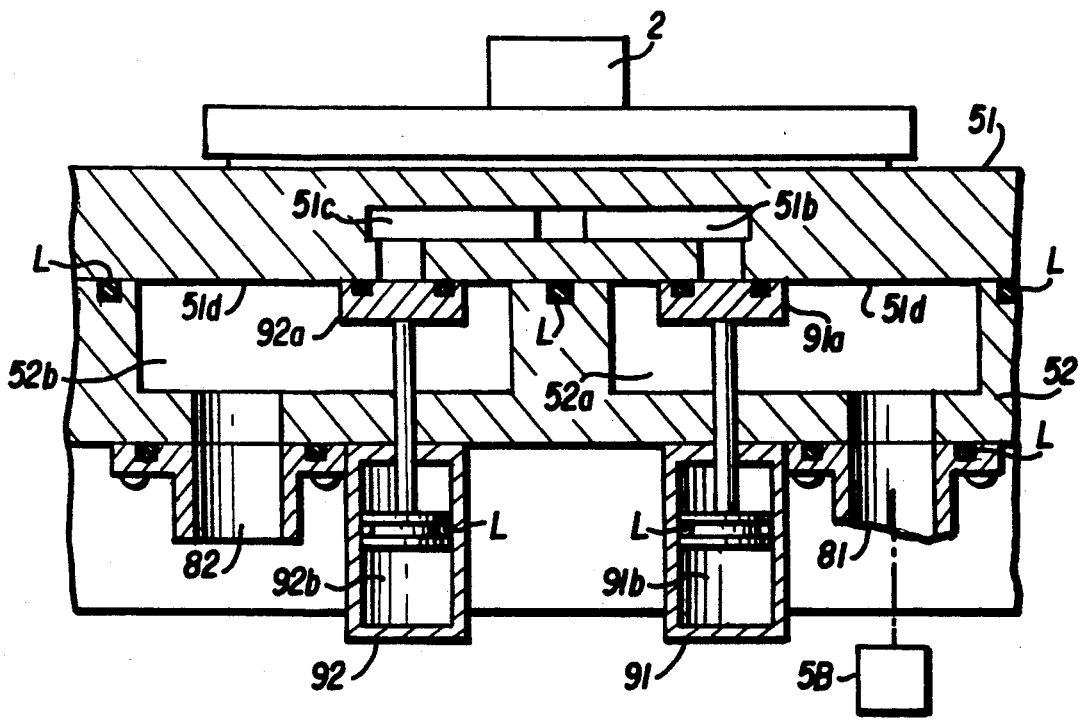
FIG. 4 is a cross-sectional view taken along line A—A of FIG. 3.
Figure 5:
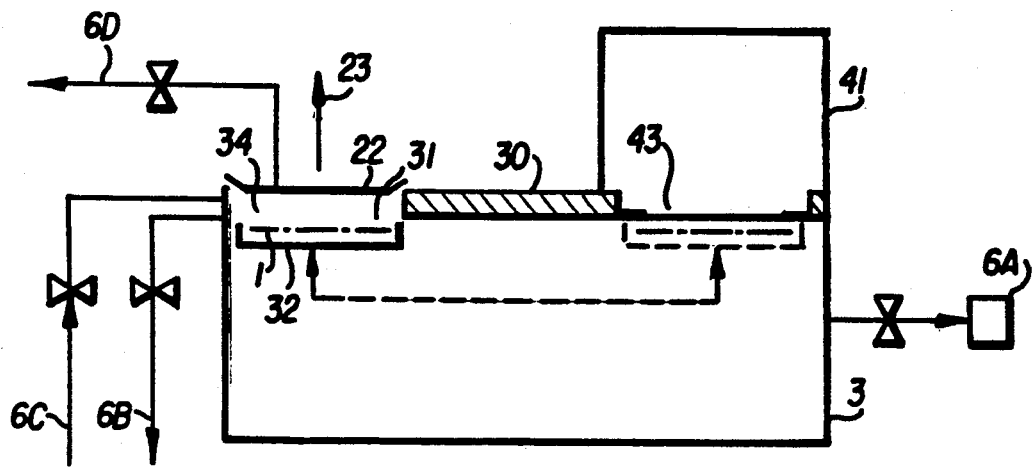
FIG. 5 is a schematic diagram illustrating a sputtering system having a conventional load-lock chamber.
Figure 6:
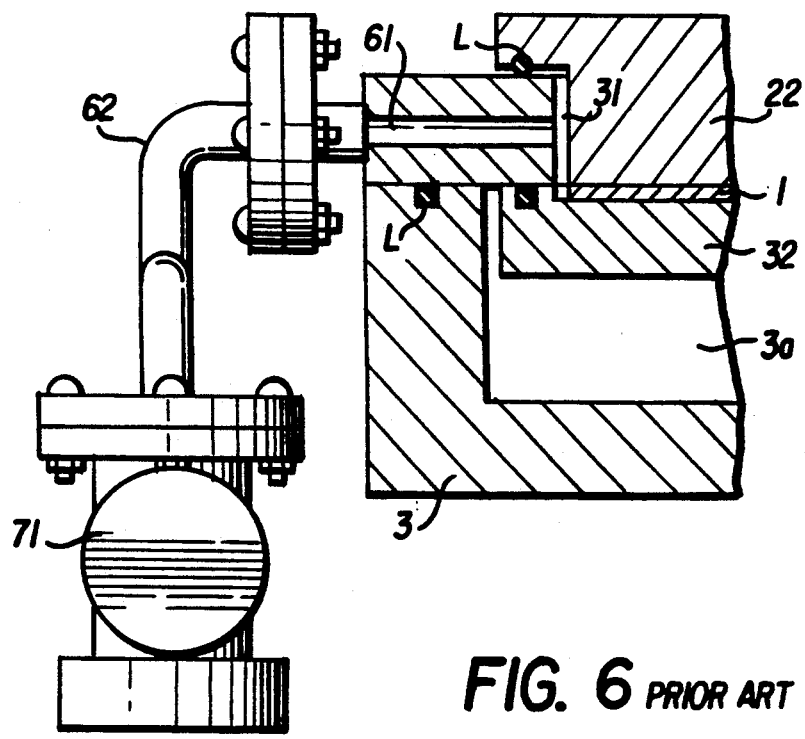
FIG. 6 is an enlarged cross-sectional view illustrating an essential portion of an exhaust-intake apparatus of the conventional load-lock chamber.
Figure 7:
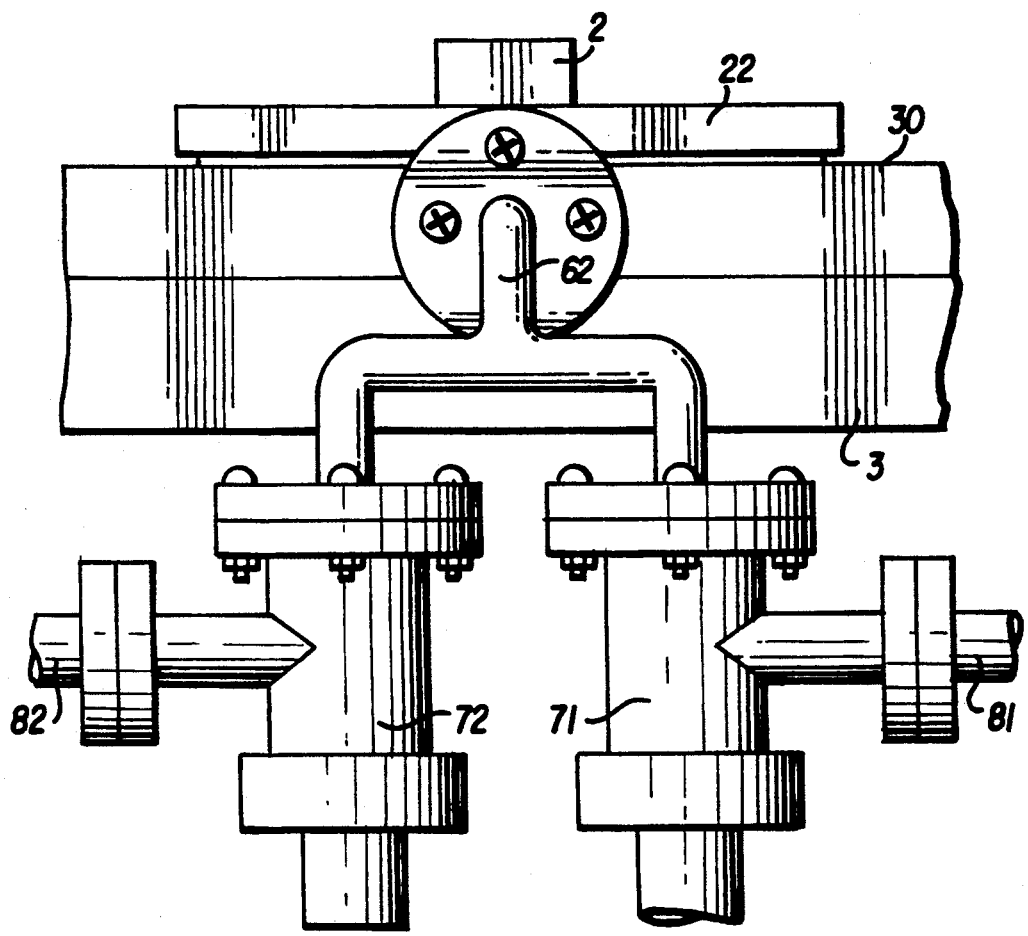
FIG. 7 is a side view of the essential portion shown in FIG. 6.

More specifically, as shown in FIG. 2 through FIG. 4, bifurcated passages 51b and 51c are formed in the wall 51 of upper lid 30. The bifurcated passages 51b and 51c have three ends, one end communicating with common passage 51a, and two other ends being respectively bent downward so as to be connected to the external plural pipes. In this embodiment, bifurcated passages 51b and 51c respectively serve as an exhaust pipe and an intake pipe with respect to load-lock chamber 31. Such two ends of bifurcated passages 51b and 51c are exposed to concave manifolds 52a and 52b formed in flange-shaped wall 52 extending in a block manner from transferring chamber 3 so as to be in contact with upper lid 30.

The manifolds 52a and 52b are respectively connected through pipes 81 and 82 to a rotary pump 5B and an atmospheric space. Further, the respective valve members 91a and 92a of a pair of valve mechanisms 91 and 92 are provided on the lower surface 51d of wall 51 of upper lid 30 in the following manner. Specifically, valve members 91a and 92a serve to open and close the respective ends of bifurcated passages 51b and 51c in accordance with the operations of valve mechanism 91 and 92, as shown in FIG. 4. Reference characters L in FIGS. 3 and 4 represent O-rings which hermetically seal transferring chamber 3 and piping apparatus 50 having valve mechanism.

In the above-described piping apparatus 50 having valve mechanism according to this embodiment, when substrate 1 is transferred to receptor 32, the end of bifurcated passage 51c is closed by valve member 92a, and the end of bifurcated passage 51b is opened by the operation of a cylinder 91b of the valve mechanism 91. Thereafter, load-lock chamber 31 is coarsely exhausted to an intermediate degree of vacuum by use of the rotary pump 5B.

Further, when the sputtered substrate 1 which has been placed on receptor 32 is taken out, the opening 34 of upper lid 30 is plugged by load-lock lid 22. Thereafter, the end of bifurcated passage 51b is closed by valve member 91a, and the end of bifurcated passage 51c is temporally opened by the operation of a cylinder 92b of valve mechanism 92. Thus, the atmospheric pressure is temporally introduced into load-lock chamber 31. As a result, the sputtered substrate 1 can be transferred from receptor 32 to load-lock lid 22, and then can be taken out from transferring chamber 3.

As described above, the vacuum chamber having the piping apparatus provided with valve mechanism according to the present invention is such that common passage 51a and bifurcated passages 51b and 51c, which communicate between the inside and outside, are formed in the wall 51 of upper lid 30 constituting load-lock chamber 31. The respective external ends of bifurcated passages 51b and 51c are directly opened and closed by valve members 91a and 92a of valve mechanisms 91 and 92. Thus, the lower surface 51d of wall 51 of upper lid 30 serves also as the inner walls of manifolds 52a and 52b. As a result, the entire valve mechanism can be constituted into a compact configuration.

In other words, unlike the conventional valve mechanism in which the valves per se are independently constituted from transferring chamber 3, the apparatus of this invention has valve members, communicating common passage and bifurfacted passages, all of which are incorporated in the wall of transferring chamber 3. Thus, the length of piping apparatus can be significantly reduced. Specifically, common passage 51a is about 10 mm high, about 18 mm wide, and about 71 mm long, this length including the manifold width of about 18 mm. The distance between the centers of valve members 91a and 92a is about 60 mm, and the conductance is about 350 l/min. This conductance valve is about twice that of the conventional passages disposed outside. Thus, the time required to exhaust load-lock chamber 31 can be halved to about 0.3 sec. A single substrate must be processed within 6 seconds, so that the reduction of the order of 0.1 second creates significant advantages.

In the above-described embodiment, a single common passage and a pair of bifurcated passages communicated therewith are formed in upper lid 30. However, the present invention is not limited to this, but may also be applied to a configuration in which a single valve mechanism is connected to a single exhaust passage. Further, the present invention may also be applied, depending on the applications, to a configuration in which a plurality of common passages (corresponding to common passage 51a communicating with load-lock chamber 31) are formed in the same wall, the plural common passages being joined each other and led to the outside. Such plural common passages may be formed into an arbitrary shape. Further, in the case when the chamber wall is made of aluminum alloy, such common passages and manifolds can be easily formed by machinery cuts using a highly accurate NC (numerical control) technique, and the thus machined walls can be easily assembled.

Hereinbefore, the description has been made as to the case when the apparatus of this invention is applied to a sputtering system. Namely, the invention can provide an apparatus having a chamber whose wall per se is utilized to incorporate communicating passages and valve mechanism. Thus, the communicating passages can be shortened, and the valve mechanism can be compacted. This can achieve larger conductance and higher reliability. Therefore, the apparatus of this invention can be widely applied to a processing system using a vacuum chamber other than an exhaust chamber. Further, this invention is not limited to the intake and exhaust of air, but may also be applied to the introduction of gasses of various kinds.

In this invention, a piping apparatus having valve mechanism is incorporated in the wall of a chamber. Thus, the compactness and higher reliability of the entire system can be obtained. This is significantly advantageous to the practical applications.

Naturally, the applications of the apparatus according to the present invention are not limited to the processing of CD disk substrates, but may also be many other applications, e.g. the processings of various objects which must be processed isolating from the atmosphere. Such applications include the processing of semiconductor wafers, the sputtering of concave reflecting mirrors for use in illumination and of other three-dimensional objects, plasma etchings and the like.

Obviously, numerous additional modifications and variations of the present invention are possible in light of the above teachings. It is therefore to be understood that within the scope of the appended claims, the invention may be practiced otherwise than as specifically described herein.

What is claimed is:

1. A sputtering apparatus having a vacuum chamber, comprising:
    a walled vacuum chamber capable of holding a pressure therein at a pressure different from an outside pressure;
    a load-lock chamber formed at a portion of said vacuum chamber, for transferring an object between the chamber and outside of said vacuum chamber while holding the pressure in said vacuum chamber at a pressure different from the outside pressure; and
    a piping apparatus comprising:
        an exhaust valve means comprising a seat and a seal means, for regulating flow of exhaust gas with respect to said load-lock chamber;
        a common passage of limited length formed within a wall of said vacuum chamber, said common passage communicating with said load-lock chamber;
        means for actuating said valve means;
        an intake passage, communicating with said common passage and an outer surface of said vacuum chamber, said intake passage further communicating with an intake gas pipe;
        an exhaust passage, communicating with said common passage and an outer surface of said vacuum chamber which forms said seat of said exhaust valve means seat, said exhaust passage further communicating with an exhaust gas pipe, said exhaust passage being interruptable by said seal means of said exhaust valve means contacting said seat of said exhaust valve means;
    wherein said valve is positioned to directly open and close said exhaust passage at the seat of said exhaust valve means.

2. The apparatus of claim 1, wherein said common passage includes bifurcations in said wall of said vacuum chamber, one of the bifurcations forming said exhaust passage and the other bifurcation forming said intake passage.

3. The apparatus of claim 2, wherein said vacuum chamber has an upper lid having an opening therein forming said load-lock chamber.

4. The apparatus of claim 3, wherein said upper lid forms means for detachably plugging said opening in a gastight manner from the outside and for transferring an object by sucking into said vacuum chamber, further including a receptor means in said vacuum chamber for detachably plugging said opening in a gastight manner from the inside and for receiving said object, said common passage being formed through said upper lid between said opening and an outer wall of said upper lid.

5. The apparatus of claim 1, wherein said object includes a disk substrate, said vacuum chamber has a sputtering chamber, said load-lock chamber is circular and disposed adjoining to said sputtering chamber, and said common passage communicating with said load-lock chamber is formed on the side of said vacuum chamber at a position closest to said load-lock chamber.

6. The apparatus of claim 1, said piping apparatus further including:
    an intake valve means comprising a seat and a seal means, for regulating flow of intake gas with respect to said load-lock chamber;
    wherein said intake passage communicates with an outer surface of said vacuum chamber to form said seat of said intake valve means thereat, said intake passage being interruptable by said seal means of said intake valve means contacting said seat of said intake valve means; and
    wherein said intake valve means and said exhaust valve means are positioned to directly open and close respectively said intake passage and said exhaust passage.

* * * * *

UNITED STATES PATENT AND TRADEMARK OFFICE
CERTIFICATE OF CORRECTION

PATENT NO. : 5,205,918
DATED : April 27, 1993
INVENTOR(S) : Kyoji KINOKIRA et al It is certified that error appears in the above-identified patent and that said Letters Patent is hereby corrected as shown below:

Column 8, claim 1, line 1, after "means" delete "seat".

Signed and Sealed this

Fourteenth Day of December, 1993

Attest:

BRUCE LEHMAN

Attesting Officer    Commissioner of Patents and Trademarks